United States Patent
Furubayashi et al.

(10) Patent No.: US 10,461,765 B2
(45) Date of Patent: Oct. 29, 2019

(54) SUCCESSIVE APPROXIMATION TYPE AD CONVERTER AND SENSOR DEVICE

(71) Applicant: HITACHI, LTD., Tokyo (JP)

(72) Inventors: Yuki Furubayashi, Tokyo (JP); Takashi Oshima, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 16/255,527

(22) Filed: Jan. 23, 2019

(65) Prior Publication Data
US 2019/0268013 A1 Aug. 29, 2019

(30) Foreign Application Priority Data
Feb. 28, 2018 (JP) ................ 2018-034688

(51) Int. Cl.
| | |
|---|---|
| H03M 1/12 | (2006.01) |
| H03M 1/68 | (2006.01) |
| G05F 3/02 | (2006.01) |
| H03F 3/45 | (2006.01) |

(52) U.S. Cl.
CPC ............ H03M 1/1295 (2013.01); G05F 3/02 (2013.01); H03F 3/45959 (2013.01); H03M 1/68 (2013.01)

(58) Field of Classification Search
CPC .......... H03M 1/468; H03M 1/46; H03M 1/38; H03M 1/12; H03M 1/1245; H03M 1/466; H03M 1/804; H03M 1/00; H03M 1/002; H03M 1/069; H03M 1/462; H03M 1/68; H03M 1/1076; H03M 1/361
USPC .................. 341/155, 144, 150, 172
See application file for complete search history.

(56) References Cited

U.S. PATENT DOCUMENTS

| | | | | |
|---|---|---|---|---|
| 6,144,331 A | * | 11/2000 | Jiang ................... | H03M 1/0682 341/150 |
| 7,741,981 B1 | * | 6/2010 | Wan ........................ | H03M 1/02 341/110 |
| 8,395,538 B2 | | 3/2013 | Das et al. | |
| 8,878,587 B1 | | 11/2014 | Steensgaard-Madsen | |
| 9,768,795 B1 | * | 9/2017 | Matsumoto ........... | H03M 1/468 |
| 2007/0115159 A1 | * | 5/2007 | Tachibana ........... | H03M 1/1023 341/144 |

(Continued)

FOREIGN PATENT DOCUMENTS

JP 2015-023581 A 2/2015

*Primary Examiner* — Linh V Nguyen
(74) *Attorney, Agent, or Firm* — Volpe and Koenig, P.C.

(57) ABSTRACT

A successive approximation type AD converter includes an in-phase voltage detection and supply circuit that supplies an in-phase voltage obtained by impedance voltage division of a first input analog signal and a second input analog signal to a first capacitance DA converter and a second capacitance DA converter. The first capacitance DA converter samples the first input analog signal with reference to the in-phase voltage, and the second capacitance DA converter samples the second input analog signal with reference to the in-phase voltage. After the sampling period ends, a comparator compares the output of the first capacitance DA converter and the output of the second capacitance DA converter, output voltages of the first capacitance DA converter and the second capacitance DA converter are changed by the control signal of a successive approximation logic unit on the basis of a comparison result, and comparison processing is repeated.

15 Claims, 11 Drawing Sheets

(56) References Cited

U.S. PATENT DOCUMENTS

| | | | | |
|---|---|---|---|---|
| 2010/0151900 A1* | 6/2010 | Koli | ............... | G11C 27/024 |
| | | | | 455/550.1 |
| 2012/0306676 A1* | 12/2012 | Balasubramaniam | ............... | |
| | | | | H03M 1/0678 |
| | | | | 341/144 |
| 2012/0319886 A1* | 12/2012 | Das | ............... | H03M 1/68 |
| | | | | 341/158 |
| 2013/0147649 A1* | 6/2013 | Cheong | ............... | H03M 1/0682 |
| | | | | 341/172 |
| 2013/0194122 A1* | 8/2013 | Sarraj | ............... | H03F 3/005 |
| | | | | 341/172 |
| 2014/0085122 A1* | 3/2014 | Jeon | ............... | H03M 1/0678 |
| | | | | 341/158 |

\* cited by examiner

WITH NO IN-PHASE
COMPONENT

DIFFERENTIAL

IN-PHASE $V_{CM}$

WITH IN-PHASE
COMPONENT

DIFFERENTIAL

IN-PHASE $V_{CM}$

SUCCESSIVE APPROXIMATION TYPE AD CONVERTER AND SENSOR DEVICE

BACKGROUND OF THE INVENTION

1. Field of the Invention

The present invention relates to a successive approximation type AD converter and a sensor device.

2. Description of the Related Art

A successive approximation type AD converter is known as an analog digital converter (ADC) that converts an input analog signal into a digital signal. The successive approximation type AD converter samples an analog input signal, and sequentially compares sampled values, to output a digital signal of the successive approximation result.

Semiconductor circuits equipped with sensors and AD converters are used in many fields such as sensors for infrastructure monitoring, sensors and control devices for automobiles, and medical measuring instruments. For example, in vibration sensors and the like, since mass production and cost reduction can be performed, micro electro mechanical systems (MEMS) is used for a sensor. Particularly in applications requiring high precision, a MEMS structure is made to have a differential configuration, a signal is doubled, and an in-phase noise is canceled, so that the S/N ratio is improved. The capacitance value of a variable capacitance pair constituting the MEMS deviates from a design value due to manufacturing variation or the like. As a result, the variable capacitance pair may include in-phase components due to capacitance deviation generated due to manufacturing variation as well as differential capacitance change due to an input signal. In general, since the latter capacitance deviation is more than 100 times larger than the former capacitance change value, even after passing through a multistage amplifier that does not have a gain for in-phase components and amplifies only differential components, in the signal input to the AD converter, an in-phase component which is originally unnecessary is often larger than that of the differential component.

As related art technology of the technical field, there is technology of using an operational amplifier (operational amplifier) in an interface circuit driving a differential AD converter, controlling an in-phase voltage to a desired voltage value, and inputting a differential signal to the differential AD converter. For example, there is technology disclosed in JP 2015-23581 A.

SUMMARY OF THE INVENTION

In a successive approximation type AD converter having a differential configuration, if there is a large in-phase component at a differential input, a malfunction of the comparator and noise deterioration occur as problems. In order to prevent this, improvement of in-phase voltage input tolerance is required so that even if an input including an in-phase component is input, the converter operates preferably.

In JP 2015-23581 A, an operational amplifier is used for controlling an in-phase voltage. In applications requiring low power performance such as infrastructure monitoring sensors, increase in power consumption due to addition of an operational amplifier is a problem.

Therefore, a successive approximation type AD converter and a sensor device with low power consumption and improved in-phase voltage input tolerance are provided.

An example of a "successive approximation type AD converter" of the present invention for solving the above problem is a successive approximation type AD converter including: a first capacitance DA converter that samples a first input analog signal and outputs a voltage corresponding to a sampled value; a second capacitance DA converter that samples a second input analog signal and outputs a voltage corresponding to a sampled value; a comparator that compares an output of the first capacitance DA converter and an output of the second capacitance DA converter; a successive approximation logic unit that supplies a control signal to the first capacitance DA converter and the second capacitance DA converter on the basis of a comparison result of the comparator; and an in-phase voltage detection and supply circuit that, in the sampling period, supplies an in-phase voltage obtained by impedance voltage division of the first input analog signal and the second input analog signal to the first capacitance DA converter and the second capacitance DA converter, the first capacitance DA converter samples the first input analog signal with reference to the in-phase voltage in the sampling period, the second capacitance DA converter samples the second input analog signal with reference to the in-phase voltage, the comparator compares the output of the first capacitance DA converter and the output of the second capacitance DA converter after the sampling period ends, output voltages of the first capacitance DA converter and the second capacitance DA converter are changed by the control signal of the successive approximation logic unit on the basis of a comparison result, comparison processing is repeated, and thereby, a digital signal of a successive approximation result is output.

According to the present invention, a successive approximation type AD converter and a sensor device with low power consumption and improved in-phase voltage input tolerance can be realized. The problems, configurations, and effects other than those described above will be clarified from the description of the preferred embodiments below.

DESCRIPTION OF THE PREFERRED EMBODIMENTS

Figure 1:
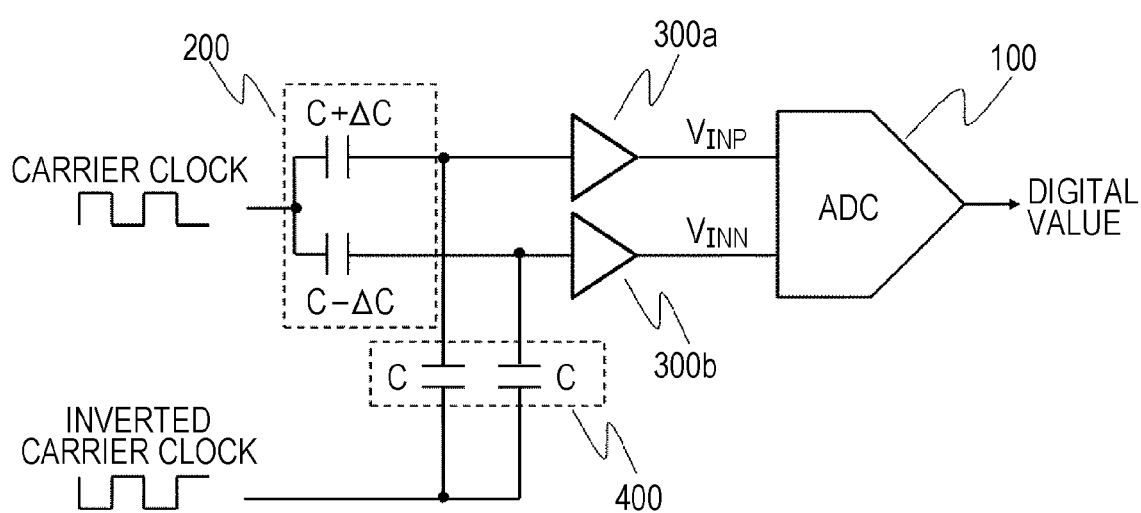
FIG. 1 is a diagram showing an example of a sensor device.

Embodiments will be described in detail with reference to the drawings. However, the present invention is not construed as being limited to the description of the embodiments described below. Those skilled in the art can easily understand that specific configurations can be changed without departing from the spirit or gist of the present invention.

In the configuration of the invention described below, the same reference numerals are used for the same parts or parts having similar functions in different drawings, and redundant explanation may be omitted.

The notations such as "first", "second" and the like in this specification and the like are provided for identifying constituent elements, and do not necessarily limit the number or order. In addition, the number for identifying the constituent element is used for each context, and the number used in one context does not necessarily indicate the same constitution in other contexts. Also, the number does not preclude that the constituent element identified by a certain number doubles as the function of the constituent element identified by another number.

FIG. 1 shows an example of a sensor device in which a sensor (sensing element) and an AD converter (ADC) are combined. FIG. 1 shows a configuration of a capacitance type MEMS acceleration sensor, which is connected to a differential capacitance type MEMS 200, C/V conversion amplifiers 300a, 300b, and a successive approximation type ADC 100 in this order. In the capacitance type MEMS 200, movable electrodes move due to an inertial force due to an externally applied acceleration signal, so that capacitance values C changes differentially by +ΔC and −ΔC, respectively. A carrier clock voltage is also applied to the MEMS, so that the change in the capacitance value is converted into a change in charge and amplitude modulated. The change of the amplitude-modulated charge is converted into a voltage change by the C/V conversion amplifiers 300a, 300b connected to the MEMS. The successive approximation type ADC 100 converts the analog signal of the amplified voltage change into a digital value. An in-phase charge component due to charging or discharging of a fixed component C of a capacitance value of the MEMS with a carrier clock voltage is ideally canceled by an in-phase charging and discharging charge by two fixed capacitance elements 400 of capacitance values C inserted between inputs of an inverted carrier clock voltage and the two C/V conversion amplifiers.

However, when there is a capacity deviation due to manufacturing variations in the MEMS, the capacitance values of the MEMS are expressed as $C+C_{CM}+C_{DF}+\Delta C$, $C+C_{CM}-C_{DF}-\Delta C$, respectively. However, $C_{CM}$ is an in-phase component of the capacitance variation, and $C_{DF}$ is a differential component.

Figure 2:
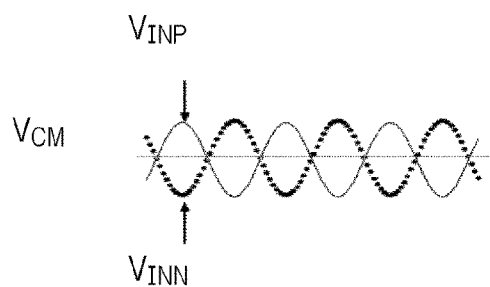
FIG. 2 is a diagram showing an input signal of an AD converter including no in-phase component.
Figure 2:
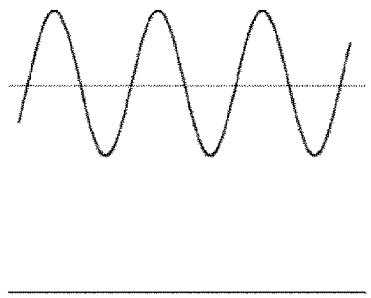
Figure 3:
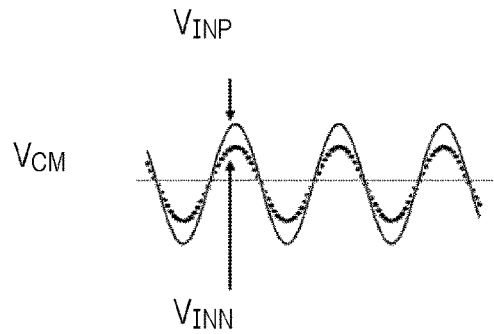
FIG. 3 is a diagram showing an input signal of an AD converter including an in-phase component.
Figure 3:
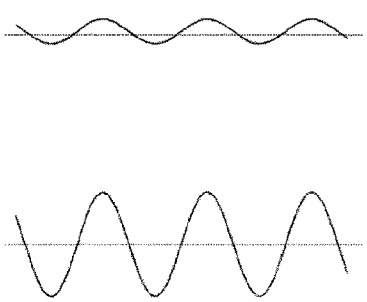

Depending on the capacitance deviation of the MEMS, an input analog signal $V_{INP}=V_{CM}(t)+V_{DF}(t)$ on the positive side of the differential input and an input analog signal $V_{INN}=V_{CM}(t)-V_{DF}(t)$ on the negative side are input to the ADC. Here, $V_{CM}(t)$ is an in-phase component, and $V_{DF}(t)$ is a differential component. Since $V_{CM}=0$ is satisfied when $C_{CM}=0$, a signal having no in-phase component as shown in FIG. 2 is input to the ADC so that the ADC can convert only the differential component $V_{DF}(t)$. On the other hand, when $C_{CM}$ is a value other than zero, a signal having an in-phase component as shown in FIG. 3 is input to the ADC so that the ADC can convert a signal including the in-phase component $V_{CM}(t)$. At that time, if the in-phase component is large, the comparator inside the ADC malfunctions or noise increases, resulting in a decrease in the resolution of the ADC.

Embodiments of the present invention for solving this problem and improving in-phase voltage input tolerance will be described below.

First Embodiment

Figure 4:
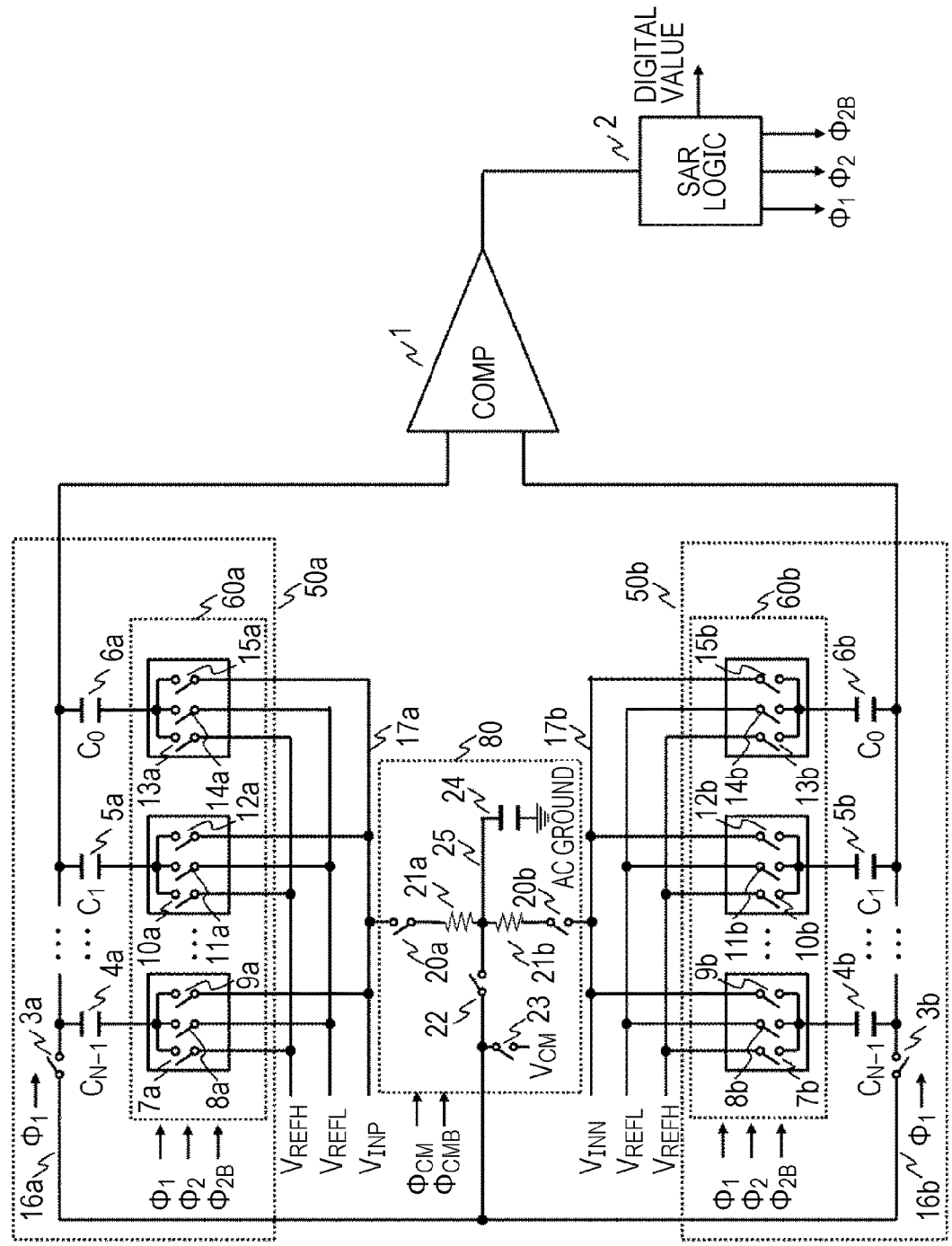
FIG. 4 is a circuit diagram showing a successive approximation type AD converter of a first embodiment.
Figure 5:
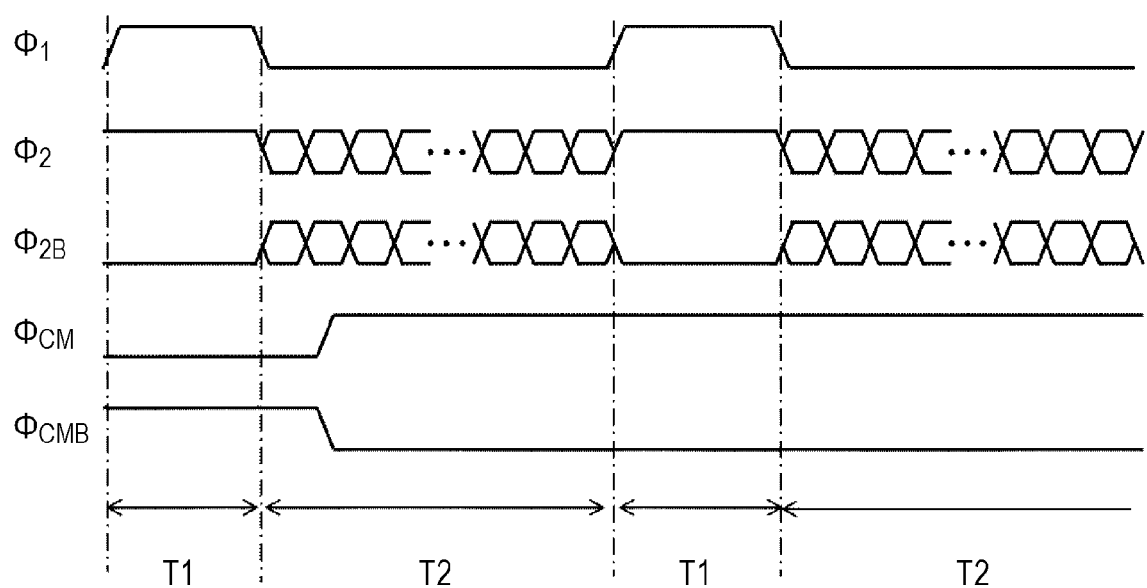
FIG. 5 is a diagram showing a clock (switch signal) for driving the successive approximation type AD converter of the first embodiment.

FIG. 4 is a circuit diagram for explaining a first embodiment of the present invention. FIG. 5 is a diagram showing a clock (switch signal) for driving the successive approximation type AD converter. The successive approximation type AD converter inputs the analog signal $V_{INP}$ on the positive side of the differential input and the analog signal $V_{INN}$ on the negative side, and outputs the AD converted digital value. The successive approximation type AD converter of FIG. 4 includes a capacitance digital analog converter (DAC) 50a to which the analog signal $V_{INP}$ on the positive side is input, a capacitance digital analog converter (DAC) 50b to which the analog signal $V_{INN}$ on the negative side is input, a comparator 1, a successive approximation logic unit 2, and nodes 17a, 17b. The capacitance DAC 50a includes N capacitance elements 4a (capacitance values $C_{N-1}$), . . . , 5a (capacitance value $C_1$), 6a (capacitance value $C_0$) weighted with constant coefficients, a node 16a, a switch 3a, and a switch array 60a. In the switch array 60a, on and off of switches 9a, 12a, 15a is controlled by high and low of a clock (switch signal) $\Phi_1$ shown in FIG. 5, on and off of switches 7a, 10a, 13a is controlled by high and low of a clock (switch signal) $\Phi_2$, and on and off of switches 8a, 11a, 14a is controlled by high and low of a clock (switch signal) $\Phi_{2B}$. On and off of the switch 3a is controlled by high and low of the clock $\Phi_1$. The explanation of the capacitance DAC 50b is similar to the description of the capacitance DAC 50a and will therefore be omitted.

The in-phase voltage detection and supply circuit 80 is connected to the nodes 16a, 16b, and the in-phase voltage detected by the in-phase voltage detection and supply circuit 80 is supplied. The input analog signals $V_{INP}$, $V_{INN}$ are connected to the in-phase voltage detection and supply circuit 80 via nodes 17a, 17b, impedance voltage division is performed by resistance elements 21a, 21b via switches 20a, 20b, and the divided voltage is generated in a node 25. The node 25 is connected to a fixed potential (AC ground) via the capacitance element 24 and is also connected to the nodes 16a, 16b of the capacitance DACs 50a, 50b via the switch 22. The node 16a and the node 16b have the same potential. The node 16a and the node 16b are connected to a common potential ($V_{CM}$) via a switch 23.

Subsequently, the operation of the successive approximation type AD converter of FIG. 4 will be described. In the capacitance DACs 50a, 50b, the switches 3a, 9a, 12a, 15a and the switches 3b, 9b, 12b, 15b are turned on during a period when $\Phi_1$ is high (sampling period T1), an output voltage of the in-phase voltage detection and supply circuit 80 is connected via the nodes 16a, 16b, and the input analog signals $V_{INP}$, $V_{INN}$ are sampled via the nodes 17a, 17b. Then, the capacitance elements 4a, 5a, 6a and the capacitance elements 4b, 5b, 6b are charged. Next, the switches 3a, 9a, 12a, 15a are turned off during the period when $\Phi_1$ is low (successive approximation period T2), and the switches 8a, 10a, 13a are turned on, so that the capacitance element 4a is connected to $V_{REFL}$, the other capacitance elements 5a, 6a are connected to $V_{REFH}$, and a voltage value of $-V_{INP}+(V_{REFH}+V_{REFL})/2$ is generated at the output of the capacitance DAC 50a. In the capacitance DAC 50b, the switches 7b, 11b, 14b are turned on, and a voltage value of $-V_{INN}+(V_{REFH}+V_{REFL})/2$ is output. The comparator 1 performs positive and negative sign determination of $-(V_{INP}-V_{INN})$ which is the difference between the output voltage of the capacitance DAC 50a and the output voltage of the capacitance DAC 50b. When $V_{INP}-V_{INN}$ is positive (nonnegative), the switch 8a is turned off and the switch 7a is turned on, so that the connection of the capacitance element 4a is switched from $V_{REFL}$ to $V_{REFH}$. At this time, the connection of the capacitance on the right side is switched from $V_{REFH}$ to $V_{REFL}$. With respect to the capacitance DAC 50b, operation in which the connection to $V_{REFH}$ and $V_{REFL}$ is reversed with respect to the capacitance DAC 50a is performed. As a result, the difference between the output voltage of the capacitance DAC 50a and the output voltage of the capacitance DAC 50b changes to $-\{V_{INP}-V_{INN}-(V_{REFH}-V_{REFL})/2\}$, and the comparator 1 performs positive and negative sign determination thereof. On the other hand, when the $V_{INP}-V_{INN}$ is negative, the connection of the capacitance element 4a remains $V_{REFL}$, and the connection of the capacitance on the right side is switched from $V_{REFH}$ to $V_{REFL}$. With respect to the capacitance DAC 50b, operation in which the connection to $V_{REFH}$ and $V_{REFL}$ is reversed with respect to the capacitance DAC 50a is performed. As a result, the difference between the output voltage of the capacitance DAC 50a and the output voltage of the capacitance DAC 50b changes to $-\{V_{INP}-V_{INN}+(V_{REFH}-V_{REFL})/2\}$, and the comparator 1 performs positive and negative sign determination thereof.

In the similar manner, while the connection to $V_{REFH}$ and $V_{REFL}$ is successively switched with respect to the smaller capacitance element, the comparator 1 successively performs the sign determination of the difference voltage between the output of the capacitance DAC 50a and the output of the capacitance DAC 50b. The above switching is performed by the successive approximation logic unit 2, clocks $\Phi_2$, $\Phi_{2B}$ are generated according to the determination result of the comparator 1, the reference voltage $V_{REFH}$ or $V_{REFL}$ is continuously selected, and each determination result is held. These determination results are output from the successive approximation logic unit 2 as a bit string of the AD conversion result.

Next, the operation of the in-phase voltage detection and supply circuit 80 of FIG. 4 will be described. In the in-phase voltage detection and supply circuit 80, on and off of the switches 20a, 20b, 22 is controlled by high and low of the clock $\Phi_{CM}$. On and off of the switch 23 is controlled by high and low of the clock $\Phi_{CMB}$. As shown in FIG. 5, when $\Phi_{CM}$ is high and $\Phi_{CMB}$ is low, the switches 20a, 20b, 22 are turned on and the switch 23 is turned off, impedance voltage division of the in-phase components of the input analog signals $V_{INP}$, $V_{INN}$ is performed by the resistance elements 21a, 21b, and connection is made to the nodes 16a, 16b of the capacitance DACs 50a, 50b via the node 25 and the switch 22.

Here, the input analog signal of the successive approximation type AD converter can be written as $V_{INP}=V_{CM}(t)+V_{DF}(t)$, $V_{INN}=V_{CM}(t)-V_{DF}(t)$ without loss of generality. Here, $V_{CM}(t)$ is an in-phase component, and $V_{DF}(t)$ is a differential component. At this time, the voltage $V_{CMR}$ of the node 25 is impedance voltage divided and $$V_{CMR}=(V_{INP}+V_{INN})/2=V_m(t)$$

is satisfied. Since the voltage of the node 25 is applied to the nodes 16a, 16b, the voltage obtained by sampling $V_{INP}$, $V_{INN}$ with respect to the common voltage $V_{CMR}$ satisfies $$V_{SAMPP}=V_{INP}-V_{CMR}=+V_{DF}(t)$$

$$V_{SAMPN}=V_{INN}-V_{CMR}=-V_{DF}(t)$$

That is, the in-phase component of the signal input to the comparator 1 is canceled. As a result, the operating potential of the differential input MOS transistor constituting the comparator can be maintained appropriately, so that the comparator can operate normally. Since the noise of the comparator depends on the in-phase potential of the input of the comparator, low noise can be maintained. Thus, even when there is an in-phase component in the input analog signals $V_{INP}$, $V_{INN}$, the differential component can be AD converted with high resolution.

The capacitance element 24 may be inserted between the connection point of the resistance element 21a and the resistance element 21b and the ground potential (ground) or fixed potential (AC ground). Assuming that the resistance values of the resistance element 21a and the resistance element 21b are both R and the capacitance value of the capacitance element 24 is C, since the frequency bandwidth of the input in-phase component captured on the node at the connection point of the resistance element 21a and the resistance element 21b is $1/(\pi RC)$, for example, the value of RC may be selected so as to be about the same as the frequency of the main component included in the input in-phase component. This is because, if the frequency bandwidth is excessively increased, a high-frequency component remains on the node 22, which in turn passes due to parasitic capacitive coupling of the switches 3a, 3b which are turned off in the successive approximation period T2, and the resolution is somewhat lowered due to the mismatch between the switches 3a, 3b of the parasitic capacitive coupling amount.

Normally, the first reference voltage $V_{REFH}$ is often the power supply voltage $V_{DD}$ and the second reference voltage $V_{REFL}$ is often the ground potential. However, in the MEMS acceleration sensor of the servo configuration, as the servo control progresses, the movable electrode of the MEMS approaches the equilibrium position, and thereby, the AC approaches zero. Therefore, after the servo control has sufficiently converged, the differential components included in the input analog signals $V_{INP}$, $V_{INN}$ of the ADC are small. Since the range in which the differential signal can be input of the ADC is determined by $V_{REFH}-V_{REFL}$, the quantization error can be reduced by paying attention to the nature of the signal, and reducing and imparting $V_{REFH}-V_{REFL}$, for example, as $V_{REFH}-0.75\ V_{DD}$, $V_{REFL}-0.25\ V_{DD}$. This is because the quantization error is proportional to $V_{REFH}-V_{REFL}$. However, at this time, since the differential component is small, there is a problem that the SN ratio after the AD conversion lowers by being affected by the in-phase component included in the input signals $V_{INP}$, $V_{INN}$. However, by using the configuration of the present invention, it is possible to suppress the influence of the in-phase component and obtain a preferable SN ratio.

In order to perform the similar operation to the conventional successive approximation type AD converter, $\Phi_{CM}$ is set low and $\Phi_{CMB}$ is set high, so that the common voltage $V_{CM}$ is connected to the nodes 16a, 16b via the switch 23.

By controlling $\Phi_{CM}$ and $\Phi_{CMB}$, it is possible to control on and off of the in-phase voltage detection and supply function of this configuration at an arbitrary timing regardless of the operation state of the successive approximation type AD converter. When the in-phase voltage detection and supply function of this configuration is turned on, at the completion of sampling, that is, at the moment when the switches 3a and 3b are turned off, noise is generated due to a slight mismatch between charges emitted from the switch 3a toward the capacitance elements 4a, 5a, 6a (charge injection and clock feedthrough) and charges emitted from the switch 3b toward the capacitance elements 4b, 5b, 6b, and the resolution is slightly reduced. Therefore, when extremely high resolution is desired to be obtained, the in-phase voltage detection and supply function may be turned off so that the conventional operation is performed.

According to the present embodiment, the in-phase components of the input analog signals $V_{INP}$, $V_{INN}$ are impedance voltage divided by the resistance element and the result is supplied to the capacitance DACs 50a, 50b via a switch. Therefore, even when an in-phase component is included in a signal input to the AD converter, the differential component can be AD converted with high resolution. Thus, it is possible to realize a successive approximation type AD converter with low power consumption and improved in-phase voltage input tolerance without using an active element such as an operational amplifier.

Second Embodiment

Figure 6:
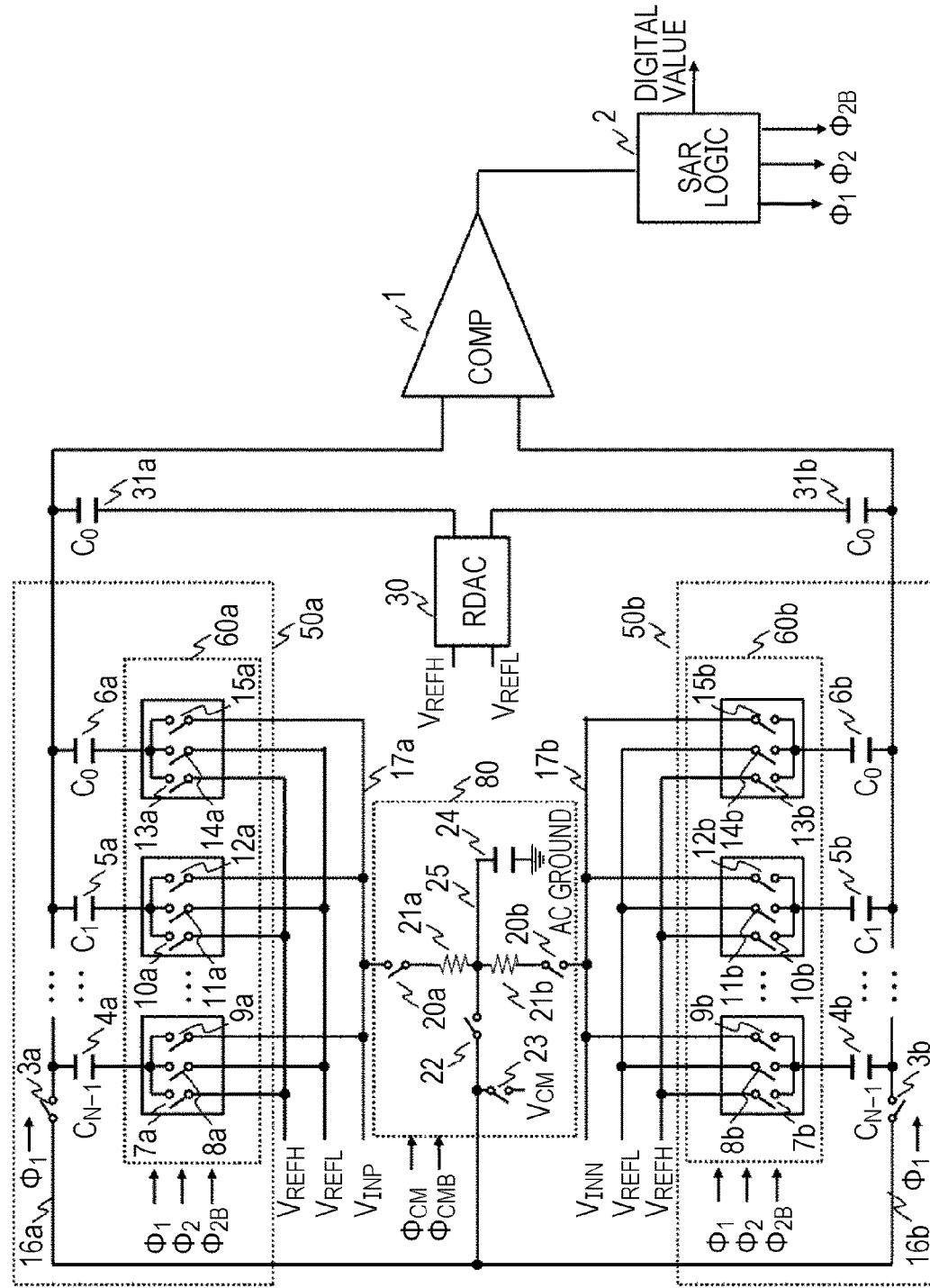
FIG. 6 is a circuit diagram showing a successive approximation type AD converter of a second embodiment.

FIG. 6 is a circuit diagram for explaining a second embodiment of the present invention. In the configuration of FIG. 6, unlike the configuration of FIG. 4, capacitance elements 31a, 31b and a resistance digital analog converter (RDAC) 30 are provided in addition to the capacitance DACs 50a, 50b. The capacitance elements 31a, 31b have the same value as the capacitance value $C_0$ of the capacitance elements 6a, 6b of the least significant bit of the capacitance DACs 50a, 50b. The resistance DAC 30 is configured to be a resistor string type or an R-2R ladder type. In addition to converting the high-order bits by the capacitance DACs 50a, 50b, the low-order bits are converted by the resistance DAC 30, so that the resolution of the AD converter can be increased. For example, such operation is disclosed in U.S. Pat. No. 8,395,538. Also in this configuration, the configuration and operation of the in-phase voltage detection and supply circuit 80 are similar to those in the first embodiment.

According to the present embodiment, in addition to the effect of the first embodiment, resolution of the successive approximation type AD converter can be enhanced by converting the low-order bits by the resistance DA converter.

Third Embodiment

Figure 7A:
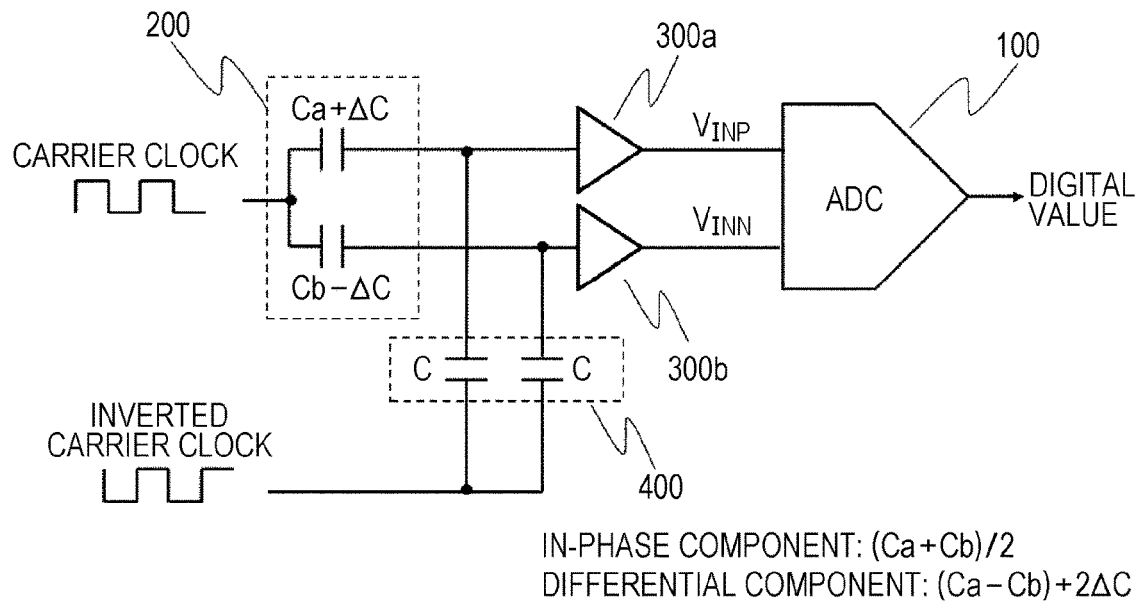
FIG. 7A is a diagram showing a sensor device of a third embodiment.

The third embodiment of the present invention is a sensor device in which a sensor that outputs a differential signal and the successive approximation type AD converter of the present invention are combined. FIG. 7A shows a sensor device of the third embodiment.

The sensor device includes the capacitance type MEMS 200 that outputs a differential signal, the C/V conversion amplifiers 300a, 300b that convert the capacitance change into a voltage change, and the successive approximation type AD converter 100 described in the first embodiment or the second embodiment that outputs a digital value obtained by inputting the amplified signal and AD converting the signal. In the differential capacitance type MEMS, a fixed electrode and a movable electrode are provided, the movable electrode moves due to an inertial force due to an externally applied acceleration, so that capacitance values C between the movable electrode and the fixed electrode changes differentially by +ΔC and −ΔC, respectively. At this time, since the capacitance value of the MEMS electrode 1 of the capacitance type MEMS 200 is Ca+ΔC and the capacitance value of the MEMS electrode 2 is Cb−ΔC, there is an in-phase component of (Ca+Cb)/2. An in-phase charge component due to charging or discharging of a fixed component C of a capacitance value of the MEMS with a carrier clock voltage is ideally canceled by an in-phase charging and discharging charge by two fixed capacitance elements (400) of capacitance values C inserted between inputs of an inverted carrier clock voltage and the two C/V conversion amplifiers. However, in reality, (Ca+Cb)/2 is deviated from C due to manufacturing variations or the like, so that an in-phase charge component proportional to the difference is generated. Therefore, in addition to the amplitude-modulated differential charge signal proportional to the change ΔC of the capacitance value, there is the in-phase charge component. The differential charge signal and the in-phase charge component are converted into a voltage change by the C/V conversion amplifiers 300a, 300b connected to the MEMS. The analog signal $V_{INP}$ on the positive side and the analog signal $V_{INN}$ on the negative side of the differential input having an in-phase component are input to the successive approximation type AD converter 100 described in the first embodiment or the second embodiment, so that in-phase component can be suppressed, the voltage signal proportional to the differential capacitance change can be AD converted, and a digital value can be output. The detection circuit including the capacitance type MEMS and the successive approximation type AD converter may be formed as an integrated semiconductor element. In FIG. 7A, the capacitance type MEMS 200 is configured as a differential type. However, the present invention is also effective in the case of a fixed capacitance in which capacitance is not changed by an acceleration signal on one side.

Figure 7B:
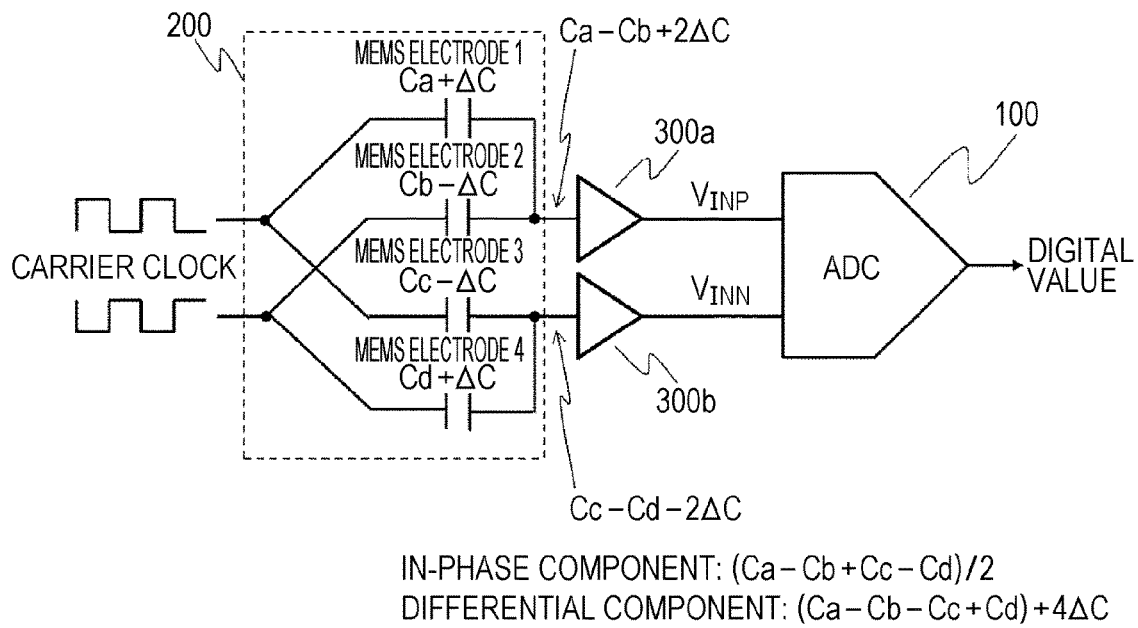
FIG. 7B is a diagram showing a modification of the sensor device of the third embodiment.

FIG. 7B shows a modification of the sensor device of the present embodiment. In this modification, the differential capacitance type MEMS 200 is used in a pair. The capacitance value of the MEMS electrode 1 is Ca+ΔC, the capacitance value of the MEMS electrode 2 is Cb−ΔC, and the charge amount generated by applying a carrier clock and an inverted carrier clock to each of the electrodes is proportional to (Ca−Cb)+2ΔC. The capacitance value of the MEMS electrode 3 is Cc−ΔC, the capacitance value of the MEMS electrode 4 is Cd+ΔC, and a carrier clock and an inverted carrier clock are applied to each of the electrodes, and the generated charge amount is proportional to (Cc−Cd)−2ΔC. Ideally, since Ca=Cb=Cc=Cd=C is satisfied, this configuration substantially cancels the charge due to the fixed capacitance and doubles the differential component. However, in reality, due to variations in MEMS manufacturing, or the like, the in-phase component of (Ca−Cb+Cc−Cd)/2 is generated. The analog signal $V_{INP}$ on the positive side and the analog signal $V_{INN}$ on the negative side of the differential input having an in-phase component are input to the successive approximation type AD converter 100 described in the first embodiment or the second embodiment, so that in-phase component can be suppressed and AD converted, and a digital value can be output.

Figure 8A:
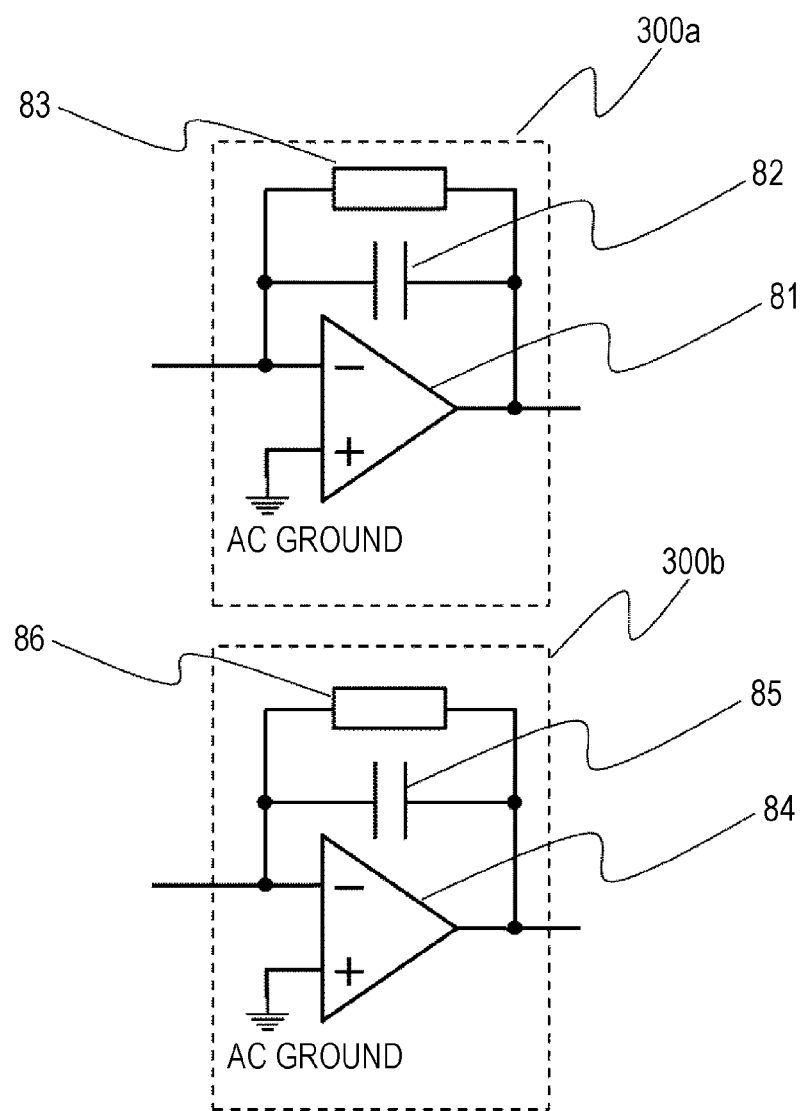
FIG. 8A is a diagram showing a C/V conversion amplifier of the third embodiment.

FIG. 8A shows an example of the C/V conversion amplifiers 300a, 300b. The C/V conversion amplifier 300a is a configuration of a capacitance type so-called operational amplifier inverting amplifier, the input capacitance is the variable capacitance of the MEMS, and the feedback capacitance is a capacitance element 82 having the fixed capacitance value. However, a high-resistance feedback resistor 83 is inserted in parallel in a feedback path. The reason for this is to secure a direct current feed path for compensating an input leakage current of the operational amplifier 81, or the like. On the other hand, a reset switch may be used in place of the feedback resistor 83. However, in that case, due to the influence of the sampling noise due to the reset switch, the noise is larger than that in the case of the feedback resistor. The thermal noise due to the feedback resistor 83 of the high resistance value can be suppressed by the low pass filter characteristic of the feedback resistor 83 and the feedback capacitor 82. The configuration and operation of the C/V conversion amplifier 300b are similar to those of the C/V conversion amplifier 300a.

Figure 8B:
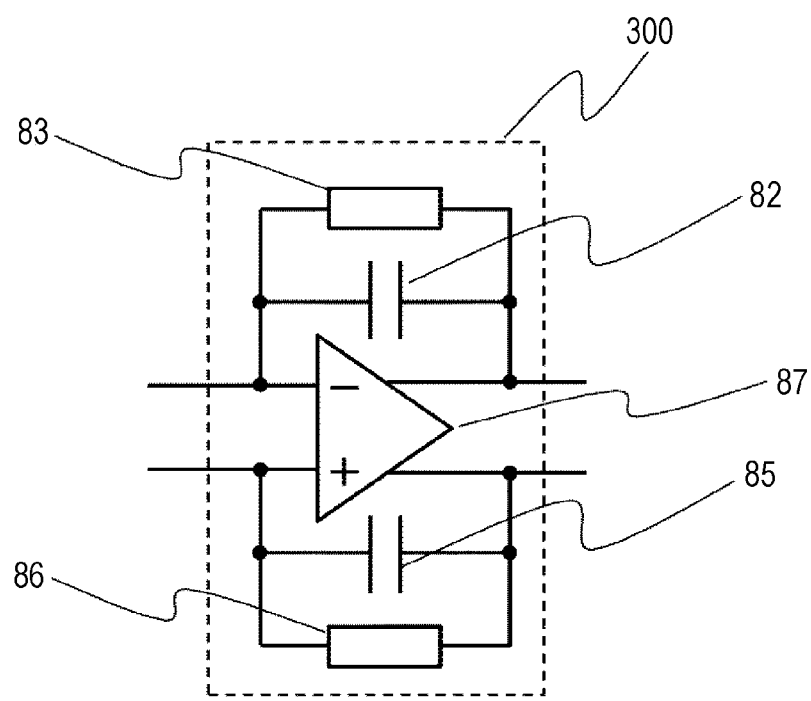
FIG. 8B is a diagram showing another example of the C/V conversion amplifier of the third embodiment.

FIG. 8B shows an example of another configuration of the C/V conversion amplifier. The difference from FIG. 8A is that one complete differential operational amplifier 87 is used. Other configurations and operations themselves are similar to those described in FIG. 8A.

In this embodiment, the capacitance type MEMS acceleration sensor has been described as an example. However, the present invention can be generally used as a sensor that outputs a differential signal as a sensing element.

Fourth Embodiment

Figure 9:
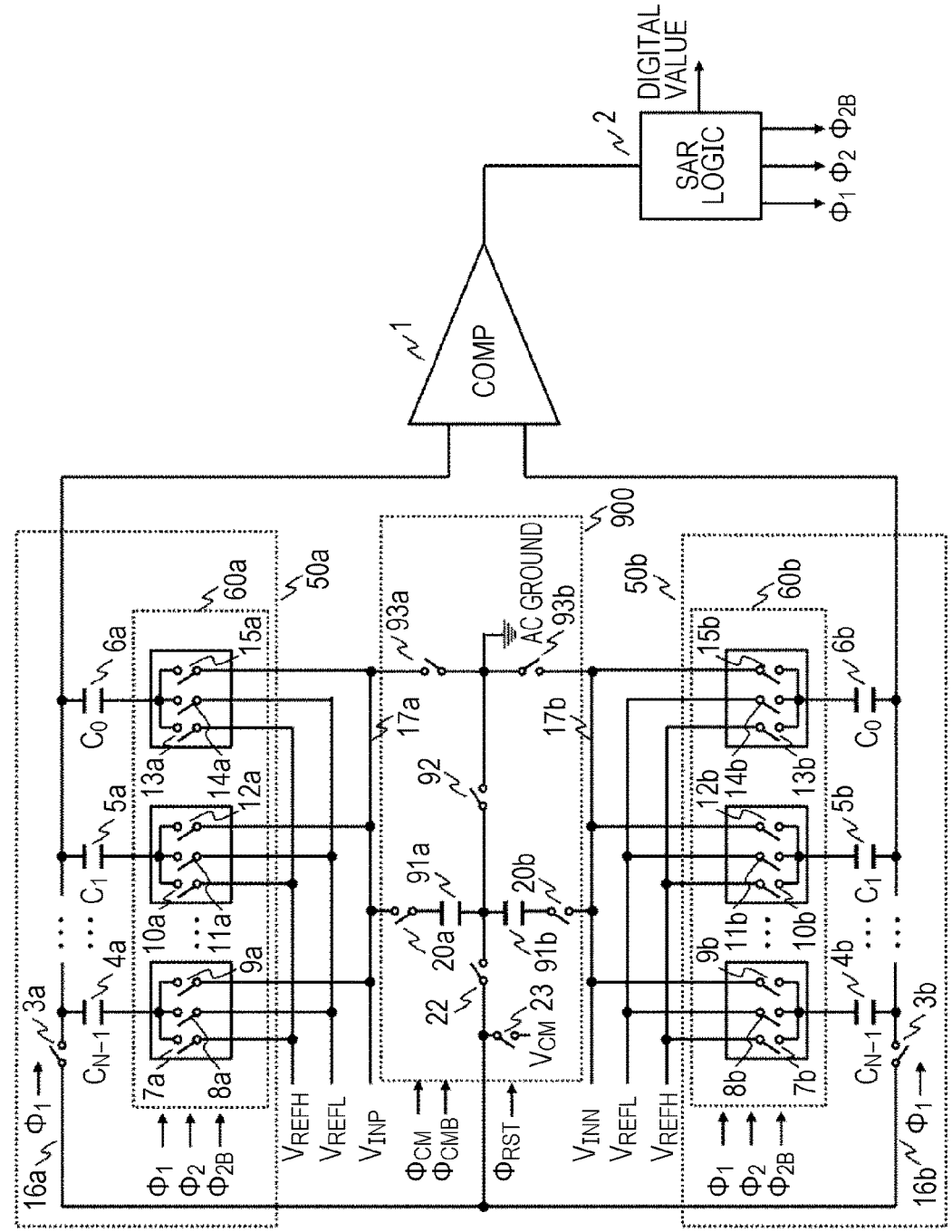
FIG. 9 is a circuit diagram showing a successive approximation type AD converter of a fourth embodiment.

FIG. 9 shows a fourth embodiment of the present invention. In the present embodiment, the resistance elements 21a, 21b in FIG. 4 are replaced by capacitance elements 91a, 91b. In the first embodiment, the in-phase components of the input analog signals $V_{INP}$, $V_{INN}$ are generated by impedance voltage division by the resistance elements 21a, 21b. In this embodiment, the in-phase components are generated by impedance voltage division by the in-phase voltage detection and supply and the capacitance elements 91a, 91b of a charge amount setting circuit 900.

Since the basic operation is similar to that of the first embodiment, different points will be described below. In the present embodiment, it is preferable that the capacitance element 24 in FIG. 4 is not provided. This is because, when the capacitance element 24 is provided, the voltage generated at the connection point between the capacitance element 91a and the capacitance element 91b deviates from the in-phase components of the input analog signals $V_{INP}$ and $V_{INN}$. In the present embodiment, since the input in-phase component of the entire frequency band is captured on the node at the connection point between the capacitance element 91a and the capacitance element 91b, the size of the switch 3a and the switch 3b are designed to be relatively small in order to suppress the passing of the captured input in-phase component due to the parasitic capacitance coupling at the off time and the reduction in resolution accompanying the passing.

In the present embodiment, a switch 92, a switch 93a, and a switch 93b are further provided. In the absence of these switches, the nodes 16a, 16b are electrically isolated from each other when the in-phase voltage detection and supply function is turned on ($\Phi_{cm}$=high, $\Phi_{CMB}$=low). In order to generate the in-phase components of the input analog signals $V_{INP}$, $V_{INN}$ by the impedance voltage division, the total charge amount on the electrodes of all the capacitance elements connected to the nodes 16a, 16b (that is, the capacitance elements 91a, 91b, 4a, 5a, 6a, 4b, 5b, 6b) needs to be zero (or a constant value). In the present embodiment, when the in-phase voltage detection and supply function is turned on, the switch 92 inserted between the connection point of the capacitance element 91a and the capacitance element 91b and the ground or AC ground (fixed potential) is turned on, the switch 93a inserted between the node 17a and the ground or AC ground is turned on, the switch 93b inserted between the node 17b and the ground or AC ground is turned on, and the switch 3a, the switch 3b, the switch 9a, the switch 12a, the switch 15a, the switch 9b, the switch 12b, and the switch 15b are turned on, so that short-circuit between both electrodes of the capacitance elements 91a, 91b, 4a, 5a, 6a, 4b, 5b, 6b occurs, and the total charge amount on the electrodes of all the capacitance elements connected to the nodes 16a, 16b can be set to zero.

The switch 92, the switch 93a, and the switch 93b are turned on in a period in which $\Phi_{RST}$ is high. In the present embodiment, as shown in the timing chart of FIG. 11, for example, at the end of the successive approximation period T2, that is, after the determination of all the bits is completed, $\Phi_{RST}$ is made high, and $\Phi_1$ is made high in order to turn the switch 3a, the switch 3b, the switch 9a, the switch 12a, the switch 15a, the switch 9b, the switch 12b, and the switch 15b on, so that the total charge amount is periodically set to zero in every AD conversion. This makes it possible to suppress the total charge amount from transitioning from zero due to a leakage current via each switch in the off state, an input leakage current of the comparator, or the like. Since short circuit of $V_{INP}$, $V_{INN}$ occurs by the ground or AC ground when $\Phi_{RST}$ is made high, a switch may be inserted before the input of the AD converter, and the switch is turned off when $\Phi_{RST}$ is high, so that the output of a circuit such as an amplifier in the preceding stage of the AD converter is not shorted by the ground or the AC ground.

Fifth Embodiment

Figure 10:
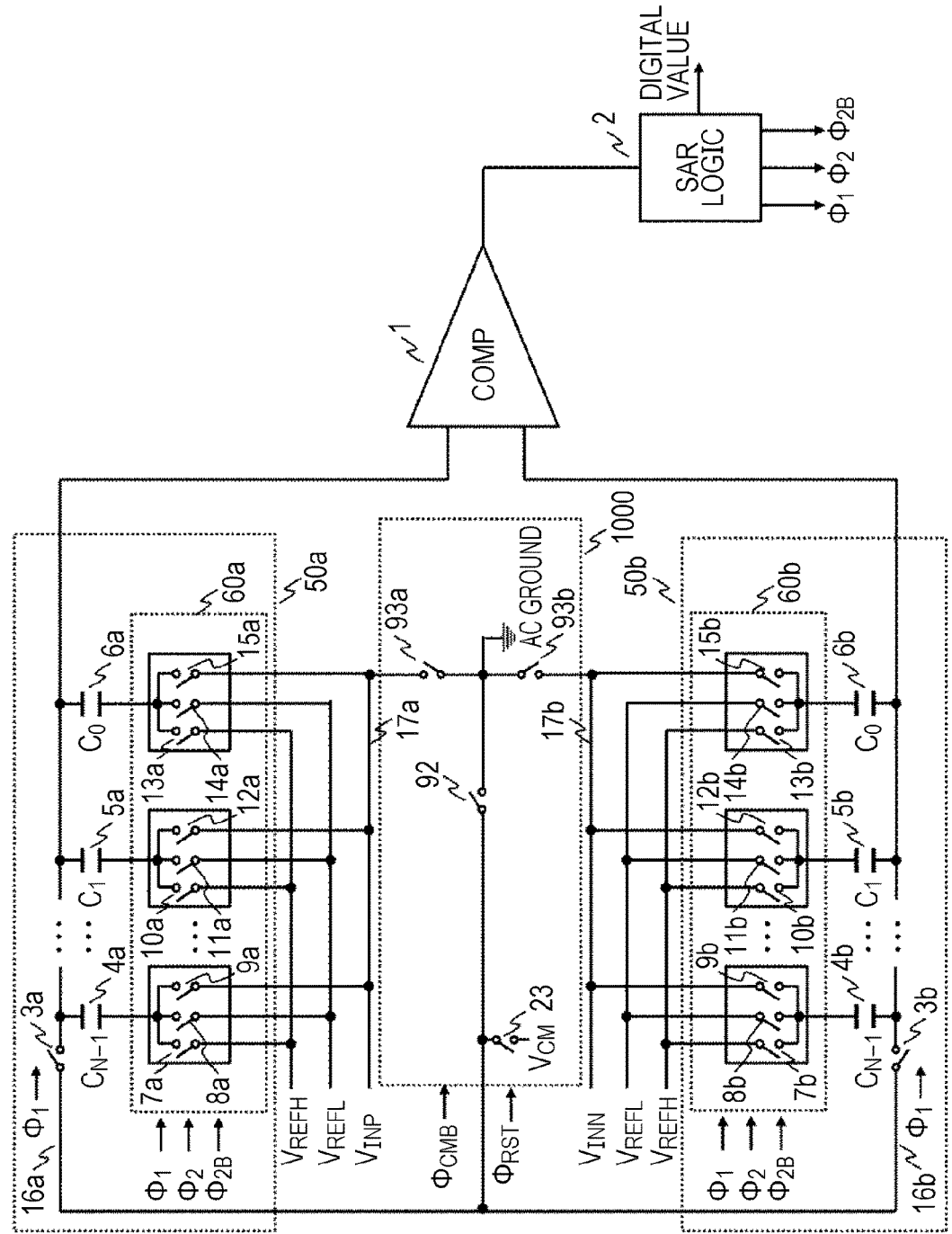
FIG. 10 is a circuit diagram showing a successive approximation type AD converter of a fifth embodiment.

FIG. 10 shows a fifth embodiment of the present invention. The present embodiment is configured by a charge amount setting circuit 1000 in which the capacitance elements 91a, 91b and the switches 20a, 20b, 22 in the fourth embodiment are removed. In the present embodiment, the impedance voltage division for generating the in-phase component of the input analog signals $V_{INP}$, $V_{INN}$ is performed using the capacitance elements 4a, 5a, 6a and the capacitance elements 4b, 5b, 6b. That is, the total capacitance value of the capacitance elements 4a, 5a, 6a is used instead of the capacitance element 91a in the fourth embodiment, and the total capacitance value of the capacitance elements 4b, 5b, 6b is used instead of the capacitance element 91b. As a result, similarly to the fourth embodiment, the input in-phase components of the entire frequency band are captured in the node 16a and the node 16b. Therefore, it is possible to obtain the similar effect by similar operation to that in the first embodiment and the fourth embodiment. Also in the present embodiment, since $V_{INP}$, $V_{INN}$ are short circuited by the ground or AC ground when $\Phi_{RST}$ is made high, a switch is inserted before the input of the AD converter, and the switch is turned off when $\Phi_{RST}$ is high, so that the output of a circuit such as an amplifier in the preceding stage of the AD converter is not short circuited by the ground or the AC ground.

Figure 11:
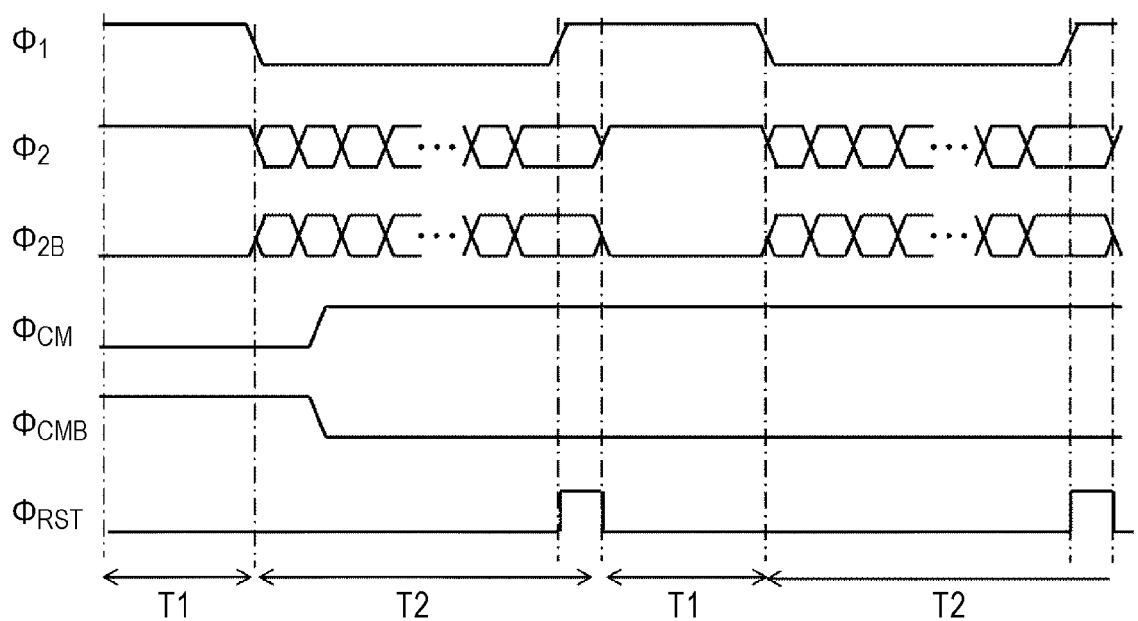
FIG. 11 is a diagram showing a clock (switch signal) for driving the successive approximation type AD converter of the fourth and fifth embodiments.

Also in the present embodiment, for example, operation in the timing chart shown in FIG. 11 can be performed. At the end of the successive approximation period T2, that is, after the determination of all bits is completed, $\Phi_{RST}$ is set to high and $\Phi_1$ is set to high, so that the total charge amount on the electrodes of all the capacitance elements connected to the nodes 16a, 16b (that is, capacitance elements 4a, 5a, 6a, 4b, 5b, 6b) is set to zero. Next, $\Phi_1$ is kept to be high and $\Phi_{RST}$ is set to low, so that the input analog signals $V_{INP}$, $V_{INN}$ are applied to the capacitance elements 4a, 5a, 6a, 4b, 5b, 6b, and a this time, the in-phase components of the input analog signals $V_{INP}$, $V_{INN}$ are generated in the node 16a and the node 16b due to impedance voltage division by the capacitance elements 4a, 5a, 6a and the capacitance elements 4b, 5b, 6b. Therefore, as described in the first embodiment, the charges charged in the capacitance elements 4a, 5a, 6a, 4b, 5b, 6b do not include the in-phase components of the input analog signals $V_{INP}$, $V_{INN}$ as similar to the case of the first and fourth embodiments. Therefore, as similar to the first embodiment and the fourth embodiment, a successive approximation type AD converter with improved in-phase voltage input tolerance can be realized.

As a successive approximation type AD converter, there is also known a circuit for connecting $V_{INP}$ to the node 16a, connecting $V_{INN}$ to the node 16b, connecting the node 17a and the node 17b with the common potential $V_{cm}$, and sampling in FIG. 4. Also in this circuit, the resistance element 21a or the capacitance element 91a are connected to the node 16a, the resistance element 21b or the capacitance element 91b is connected to the node 16b, and the connection point between the resistance element 21a and the resistance element 21b, or the connection point between the capacitance element 91a and the capacitance element 91b is connected to the node 17a and the node 17b, so that similar operation to that in the first embodiment and the fourth embodiment is performed and similar effect can be obtained. At that time, the switch 93a and the switch 93b in FIG. 9 may be connected to the node 16a and the node 16b, respectively. In order to perform operation corresponding to the fifth embodiment, in FIG. 10, in the circuit in which $V_{INP}$ is connected to the node 16a and $V_{INN}$ is connected to the node 16b, the switch 93a and the switch 93b are connected to the node 16a and the node 16b, respectively, and the node 17a and the node 17b are short circuited and connected to the switch 92. As a result, it is possible to obtain the similar effect by similar operation to that in the fifth embodiment.

What is claimed is:

1. A successive approximation type AD converter comprising:
    a first capacitance DA converter that samples a first input analog signal and outputs a voltage corresponding to a sampled value;
    a second capacitance DA converter that samples a second input analog signal and outputs a voltage corresponding to a sampled value;
    a comparator that compares an output of the first capacitance DA converter and an output of the second capacitance DA converter;
    a successive approximation logic unit that supplies a control signal to the first capacitance DA converter and the second capacitance DA converter on the basis of a comparison result of the comparator; and
    an in-phase voltage detection and supply circuit that, in a sampling period, supplies an in-phase voltage obtained by impedance voltage division of the first input analog signal and the second input analog signal to the first capacitance DA converter and the second capacitance DA converter,
    wherein the first capacitance DA converter samples the first input analog signal with reference to the in-phase voltage in the sampling period, the second capacitance DA converter samples the second input analog signal with reference to the in-phase voltage,
    after the sampling period ends, the comparator compares the output of the first capacitance DA converter and the output of the second capacitance DA converter, output voltages of the first capacitance DA converter and the second capacitance DA converter are changed by the control signal of the successive approximation logic unit on the basis of a comparison result, comparison processing is repeated, and thereby, a digital signal of a successive approximation result is output.

2. The successive approximation type AD converter according to claim 1, wherein
    the first capacitance DA converter and the second capacitance DA converter comprise
    a plurality of capacitance elements weighted with a constant coefficient, and
    a switch array that connects each of the capacitance elements and reference voltages according to a control signal of the successive approximation logic unit.

3. The successive approximation type AD converter according to claim 2, wherein
    the reference voltages to be supplied to the first capacitance DA converter and the second capacitance DA converter are a first reference voltage and a second reference voltage lower than the first reference voltage.

4. The successive approximation type AD converter according to claim 1, wherein
    the impedance voltage division is performed by using two resistance elements connected between the first input analog signal and the second input analog signal.

5. The successive approximation type AD converter according to claim 1, wherein
    the first analog input signal and the second analog input signal are signals having an in-phase component and a differential component.

6. The successive approximation type AD converter according to claim 1, wherein the impedance voltage division is performed by using two capacitance elements connected between the first input analog signal and the second input analog signal.

7. The successive approximation type AD converter according to claim 1, further comprising
    a switch that switches between the in-phase voltage detection and supply circuit and a common voltage, wherein a common voltage can be supplied to the first DA converter and the second DA converter.

8. The successive approximation type AD converter according to claim 1, wherein
    the in-phase voltage detection and supply circuit includes the first capacitance DA converter and the second capacitance DA converter, and performs impedance voltage division by using a capacitance element of the first capacitance DA converter and a capacitance element of the second capacitance DA converter.

9. The successive approximation type AD converter according to claim 8, wherein
    the capacitance element of the first capacitance DA converter and the capacitance element of the second capacitance DA converter are charged and discharged at least one time using a DC potential.

10. The successive approximation type AD converter according to claim 8, wherein
    the capacitance element of the first capacitance DA converter and the capacitance element of the second capacitance DA converter are charged and discharged at least one time using a ground potential.

11. The successive approximation type AD converter according to claim 1, wherein
    the capacitance elements are further connected to each of output sides of the first capacitance DA converter and the second capacitance DA converter, and a resistance DA converter is connected to the capacitance elements.

12. A successive approximation type AD converter of differential input, the successive approximation type AD converter comprising:
a first capacitance DA converter; a second capacitance DA converter; a comparator; a successive approximation logic unit; and an in-phase voltage detection and supply circuit,
wherein the in-phase voltage detection and supply circuit performs impedance voltage division with respect to a first input analog signal and a second input analog signal in a sampling period to connect the result to a first terminals of the first capacitance DA converter and the second capacitance DA converter, the first input analog signal and the second input analog signal are connected to second terminals of the first capacitance DA converter and the second capacitance DA converter and sampling is performed,
after the sampling period ends, the comparator compares the output of the first capacitance DA converter and the output of the second capacitance DA converter, output values of the first capacitance DA converter and the second capacitance DA converter are changed by the control signal of the successive approximation logic unit on the basis of a comparison result, successive approximation processing is repeated, and thereby, a digital value is output.

13. A sensor device comprising a sensor that outputs a differential detection signal, and a successive approximation type AD converter in which the differential detection signal of the sensor is input, wherein the successive approximation type AD converter comprises:
a first capacitance DA converter that samples a first input analog signal and outputs a voltage corresponding to a sampled value;
a second capacitance DA converter that samples a second input analog signal and outputs a voltage corresponding to a sampled value;
a comparator that compares an output of the first capacitance DA converter and an output of the second capacitance DA converter;
a successive approximation logic unit that supplies a control signal to the first capacitance DA converter and the second capacitance DA converter on the basis of a comparison result of the comparator; and
an in-phase voltage detection and supply circuit that, in a sampling period, supplies an in-phase voltage obtained by impedance voltage division of the first input analog signal and the second input analog signal to the first capacitance DA converter and the second capacitance DA converter,
the first capacitance DA converter samples the first input analog signal with reference to the in-phase voltage in the sampling period, the second capacitance DA converter samples the second input analog signal with reference to the in-phase voltage,
after the sampling period ends, the comparator compares the output of the first capacitance DA converter and the output of the second capacitance DA converter, output voltages of the first capacitance DA converter and the second capacitance DA converter are changed by the control signal of the successive approximation logic unit on the basis of a comparison result, comparison processing is repeated, and thereby, a digital signal of a successive approximation result is output.

14. The sensor device according to claim 13, wherein
the sensor is a capacitance MEMS sensor, and
the sensor device further comprises a C/V conversion amplifier between the capacitance type MEMS sensor and the successive approximation type AD converter.

15. The sensor device according to claim 13, wherein
a first reference voltage and a second reference voltage lower than the first reference voltage are supplied to the first capacitance DA converter and the second capacitance DA converter, and
a difference between the first reference voltage and the second reference voltage is varied according to amplitude of the differential detection signal.

* * * * *